US011750303B2

(12) United States Patent
Vanwiggeren (10) Patent No.: US 11,750,303 B2
(45) Date of Patent: Sep. 5, 2023

(54) COMPACT SYSTEM FOR CHARACTERIZING A DEVICE UNDER TEST (DUT) HAVING INTEGRATED ANTENNA ARRAY

(71) Applicant: Keysight Technologies, Inc., Santa Rosa, CA (US)

(72) Inventor: Gregory Douglas Vanwiggeren, San Jose, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 16/141,444

(22) Filed: Sep. 25, 2018

(65) Prior Publication Data

US 2019/0036621 A1  Jan. 31, 2019

Related U.S. Application Data

(63) Continuation-in-part of application No. 15/583,104, filed on May 1, 2017, now abandoned.
(Continued)

(51) Int. Cl.
| | |
|---|---|
| *H04B 17/10* | (2015.01) |
| *H04B 17/354* | (2015.01) |
| *H04B 17/00* | (2015.01) |
| *G01R 29/10* | (2006.01) |
| *H04B 17/391* | (2015.01) |

(52) U.S. Cl.
CPC ......... *H04B 17/102* (2015.01); *G01R 29/105* (2013.01); *H04B 17/0087* (2013.01); *H04B 17/354* (2015.01); *H04B 17/391* (2015.01)

(58) Field of Classification Search
CPC .. H04B 17/102; H04B 17/354; H04B 17/391; H04B 17/0087; G01R 29/105
See application file for complete search history.

(56) References Cited

U.S. PATENT DOCUMENTS

| | | | |
|---|---|---|---|
| 5,410,324 | A | 4/1995 | Bolomey et al. |
| 7,915,909 | B2 | 3/2011 | Dunn et al. |
| (Continued) | | | |

FOREIGN PATENT DOCUMENTS

| | | |
|---|---|---|
| CN | 101997618 A | 3/2011 |
| CN | 102016608 A | 4/2011 |
| (Continued) | | |

OTHER PUBLICATIONS

Hamman Shakhtour et al., "Measurement of an Active Radar Module in a Compact Antenna Test Range," Microwave Journal, Oct. 14, 2014, pp. 1-6.
(Continued)

*Primary Examiner* — Junpeng Chen (57) ABSTRACT

A system is provided for characterizing a device under test (DUT) including an integrated antenna array. The system includes an optical subsystem having first and second focal planes, where the integrated antenna array is positioned in a beam overlap region extending from the first focal plane of the optical subsystem. The system further includes a measurement array having multiple array elements positioned substantially on the second focal plane of the optical subsystem, the measurement array being configured to receive signals from the DUT, and/or to transmit substantially collimated beams to the DUT, via the optical subsystem. Far-field characteristics of the DUT are measured, as well as angular dependence of each of the far-field characteristics.

22 Claims, 4 Drawing Sheets

Related U.S. Application Data (60) Provisional application No. 62/726,044, filed on Aug. 31, 2018, provisional application No. 62/380,984, filed on Aug. 29, 2016, provisional application No. 62/357,120, filed on Jun. 30, 2016.

(56) References Cited

U.S. PATENT DOCUMENTS

| | | | |
|---|---|---|---|
| 8,525,744 | B2 | 9/2013 | Teshirogi et al. |
| 2002/0176149 | A1 | 11/2002 | Davis et al. |
| 2010/0285753 | A1* | 11/2010 | Foegelle ............... H04B 17/21 455/67.12 |
| 2011/0043418 | A1* | 2/2011 | Teshirogi ........... G01R 29/0821 343/703 |
| 2012/0134400 | A1 | 5/2012 | Ding et al. |
| 2014/0273873 | A1* | 9/2014 | Huynh .................. H04B 17/29 455/67.12 |
| 2015/0123672 | A1* | 5/2015 | Ao ..................... G01R 29/0814 324/512 |
| 2016/0226601 | A1* | 8/2016 | Hu ......................... H04B 7/06 |
| 2016/0226709 | A1* | 8/2016 | Chen ................... G01R 29/105 |
| 2017/0012714 | A1* | 1/2017 | Kildal ................. H04B 17/102 |
| 2018/0006745 | A1 | 1/2018 | Vanwiggeren |

FOREIGN PATENT DOCUMENTS

| | | |
|---|---|---|
| CN | 205356355 U | 6/2016 |
| RU | 1810843 A1 | 4/1993 |

OTHER PUBLICATIONS

P. Iversen et al., "Mini Compact Range for Automotive RADAR Antenna Testing," 6th European Conference on Antennas and Propagation (EUCAP), 2011, pp. 2240-2243.

Wolfgang Haselwander et al., "Measurement on an Active Phased Array Antenna on a Near-Field Range and an Anechoic Far-Field Chamber," 31st European Microwave Conference, 2001, pp. 1-5.

Ron Sauerman et al., "A Compact Antenna Test Range Built to Meet the Unique Testing Requirements for Active Phased Array Antennas," Microwave Instrumentation Technologies, pp. 1-4.

A. D. Olver, "Compact Antenna Test Ranges," Antennas and Propagation, 1991. ICAP 91., Seventh International Conference on (IEE), pp. 99-108.

"Lecture 8: Basic Methods in Antenna Measurements," Nikolova 2014, pp. 1-40.

Chinese Office Action dated Dec. 11, 2020 for CN Application 201710499798.2, with English translation, 21 pgs.

Decision to Grant dated Jul. 23, 2021 for CN Application 201710499798. 2, with English translation, 4 pgs.

IEEE Standard Test Procedures for Antennas, IEEE Std 149,1979, IEEE, Inc., 1979, distributed by Wiley, Interscience, pp. 1-135.

J. S. Hollis et al., "Microwave Antenna Measurements", Scientific, Atlanta, Inc., Atlanta, Georgia, 1969, pp. 1-606. (broken up to pp. 1-202, 203-422, and 243-606).

Wolfgang H. Kummer et al., "Antenna measurements—1978," Proc. IEEE, vol. 66, No. 4, Apr. 1978, pp. 483-507.

John D. Kraus, "Antennas", 2nd ed., McGraw Hill, Inc., New York, 1988, pp. 1-460.

John R. Jones et al., "Automated three-antenna polarization measurements using digital signal processing," Antenna Measurement Techniques Association, Oct. 1985, pp. 1-12.

Edward B. Joy et al., "A practical method for measuring the complex polarization ratio of arbitrary antennas," IEEE Trans. on Antennas and Propagation, vol. AP-21, No. 4, Jul. 1973, pp. 432-435.

A.C. Newell et al., "Determination of both polarization and power gain of antennas by a generalised 3-antenna measurement method," Electronics Letters, vol. 7, No. 3, Feb. 11, 1971, pp. 68-70.

Constantine A. Balanis' "Antenna Theory", 2nd ed., John Wiley & Sons, Inc., New York, 1997, pp. 1-11.

* cited by examiner

COMPACT SYSTEM FOR CHARACTERIZING A DEVICE UNDER TEST (DUT) HAVING INTEGRATED ANTENNA ARRAY

PRIORITY

The present application claims priority under 35 U.S.C. § 119(e) from commonly owned U.S. Provisional Application No. 62/726,044, filed on Aug. 31, 2018, to Gregory VanWiggeren, and is a continuation-in-part under 37 C.F.R. § 1.53(b) of commonly owned U.S. patent application Ser. No. 15/583,104 to VanWiggeren, filed on May 1, 2017 (published as U.S. Patent App. Pub. No. 2018/0006745 on Jan. 4, 2018), which claims the benefit under 35 U.S.C. § 119(e) of commonly owned U.S. Provisional Application No. 62/357,120, filed on Jun. 30, 2016, to VanWiggeren, and from commonly owned U.S. Provisional Application No. 62/380,984, filed on Aug. 29, 2016, to VanWiggeren. The entire disclosures of U.S. application Ser. No. 15/583,104, and U.S. Provisional Application Nos. 62/357,120, 62/380,984 and 62/726,044, are specifically incorporated herein by reference.

BACKGROUND

Antenna arrays are increasingly used in electronic communications, including in the aerospace defense industry and the wireless telecommunications industry, for example. Antenna array test and calibration solutions are used to characterize the antenna arrays. Conventional solutions for test and calibration depend primarily on a vector network analyzer, which requires the device under test (DUT) including the antenna array, or antenna under test (AUT), to have radio frequency (RF) connectors, such as coaxial connectors, in order to perform the test and calibration. However, with the evolution of wireless communication technologies, antenna arrays with direct connections to (i.e., integrated with) RF transceivers of DUTs, and having no RF connectors, are becoming increasingly common. Such antenna arrays may be referred to as integrated antenna arrays. Overall performance of such a DUT presently must be tested "over-the-air," since there is no place to connect a coaxial cable from the DUT and/or the antenna array to the test equipment. In fact, due to antenna array integration, overall DUT performance must now be tested as a function of the antenna array configuration. For instance, when a signal comprises multiple beams, the DUT performance must be characterized over a range of beam angles and/or widths.

Conventional solutions for over-the-air testing are aimed primarily at measurements by a single antenna (probe). However, with the advent of mmW wireless communication standards, such as IEEE 802.11ad, and the advent of 5G networks, cost, size and speed become key attributes of test methodology. To characterize performance, various attributes of the DUT, such as antenna profile, effective isotropic radiated power (EIRP), total radiated power, error-vector-magnitude (EVM) of the modulation, and adjacent channel leakage ratios (ACLRs), for example, must all be characterized as a function of beam angles. Currently, this involves a very time-consuming process. For example, characterizing just the antenna profiles of a DUT as a function of beam angles may take hours.

Antenna characterization processes typically take place either at an outdoor test range or in an anechoic chamber test range. The outdoor test ranges are used for antennas having a very long far-field (e.g., greater than 5 m), rendering use of an indoor test range or anechoic chamber impractical. Anechoic test ranges are shielded chambers with walls covered in absorbing material that minimizes internal reflections, typically by several tens of decibels.

There are a number of basic conventional techniques for antenna characterization using an anechoic chamber. First, for example, there is a simple-far-field measurement technique, which is appropriate when the antenna's far-field occurs at a sufficiently short distance that it can be measured in a chamber of practical size, e.g., less than a couple meters on the longest side. Second, there is the near-field measurement technique, according to which near-field measurements are mathematically transformed to the far-field. This type of measurement involves a raster scan over a plane in front of an antenna, or a cylinder or spherical surface around an antenna, and then a Fourier transform of corresponding measurements to calculate the far-field pattern of the antenna. Third, there is a compact anechoic test range (CATR) technique, according to which an approximately uniform source (a single probe antenna) illuminates a curved mirror with a radiated signal where the resulting reflection provides a nearly perfectly collimated beam. In this way, the antenna of the DUT with a long far-field distance can be positioned in the collimated beam, and its antenna pattern determined as the received power changes as a function of rotation angle (elevation and azimuth) of the DUT. The collimated reflection from the curved mirror allows the DUT to be characterized in the far-field in a more compact chamber than would otherwise be possible without the curved mirror.

However, for the types of antenna arrays that will be developed for 5G backhaul or last mile applications, there may be many antenna elements, and the far-field may be prohibitively large, especially for mmWave frequencies, for the simple far-field measurements to be performed in an anechoic chamber. For manufacturing testing, an outdoor test range is also precluded. Only the second and third techniques, for example, may be considered for these sorts of long far-field devices.

Also, for the new generation of integrated antenna arrays, the antenna array cannot be tested in isolation. In other words, it is not sufficient, or even possible since the antenna array is directly integrated with the transceiver, to simply test the antenna profile, and then separately test the functionality of the transmitter and/or receiver chain of the DUT with which the antenna array is integrated. Rather, the transmitter and/or receiver chains must be tested with the antenna arrays.

Making near-field measurements and transforming to obtain the far-field, as in the second technique described above, can provide the far-field antenna profile information in a smaller chamber. However, this approach has some drawbacks. For example, this near-field technique is quite slow. A raster scan of sufficient resolution requires a precision automated process that typically requires several hours. Also, modern DUTs with integrated antenna arrays must be characterized more fully for proper functioning, typically by measuring EVM and ACLRs. While the far-field beam profile may be determined from a transform of near-field measurements, EVM versus beam angle may not be possible with this approach. EVM would have to be measured at many different locations and somehow a mathematical algorithm to predict EVM at a spatial location in the far-field would have to be developed. For many anticipated applications, EVM measurements with less than two percent uncertainty are likely to be required, which would make this approach challenging, especially when one or more components (e.g. power amplifiers) in the transmitter chain are not linear. Also, when the integrated antenna array is to be tested in receive mode, the received signal must appear to be coming from the far-field and the EVM of the receive chain characterized. This is also not possible with a small raster-scanned probe in the near-field. Furthermore, typical receive-mode characterization is performed in the presence of a "blocker," which is another transmitter at an angle of incidence other than the actual transmitter being tested. Recreating this scenario in a near-field manner is very difficult.

The third technique, while again suitable for antenna profile measurement, is likewise not appropriate for testing of a DUT, including the transmit and receive chains, with an integrated antenna array. Typically, the receiver EVM and ALCRs must be tested in the presence of interfering signals called blockers, provided at different angles of incidence than the desired signal to be demodulated, as mentioned above. Also, the harmonics and out-of-band (OOB) spurs of the DUT must be characterized. But the conventional CATR approach employs only a single probe antenna at the focal point of the reflector or lens to create the collimated beam through the quiet zone of the chamber. Also, the specialized antennas needed to provide the relatively uniform and symmetric collimated beams are not wide-band, so measurements of other frequencies, e.g., harmonics, can only be done by replacing, at the focal point, the original probe antenna with another that operates at the new frequencies under test.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, according to various embodiments, complete far-field characterization of a device under test (DUT) with an integrated antenna array (e.g. transmit and receive chains included) may be made using an anechoic chamber. That is, a measurement array having multiple array elements in the anechoic chamber is configured to measure far-field characteristics of the DUT, as well as angular dependence of each of the far-field characteristics. Further, multi-channel measurements and fast antenna profile measurements are also possible using the multiple array elements, which may include detectors, power sensors or other measurement elements.

Figure 1:
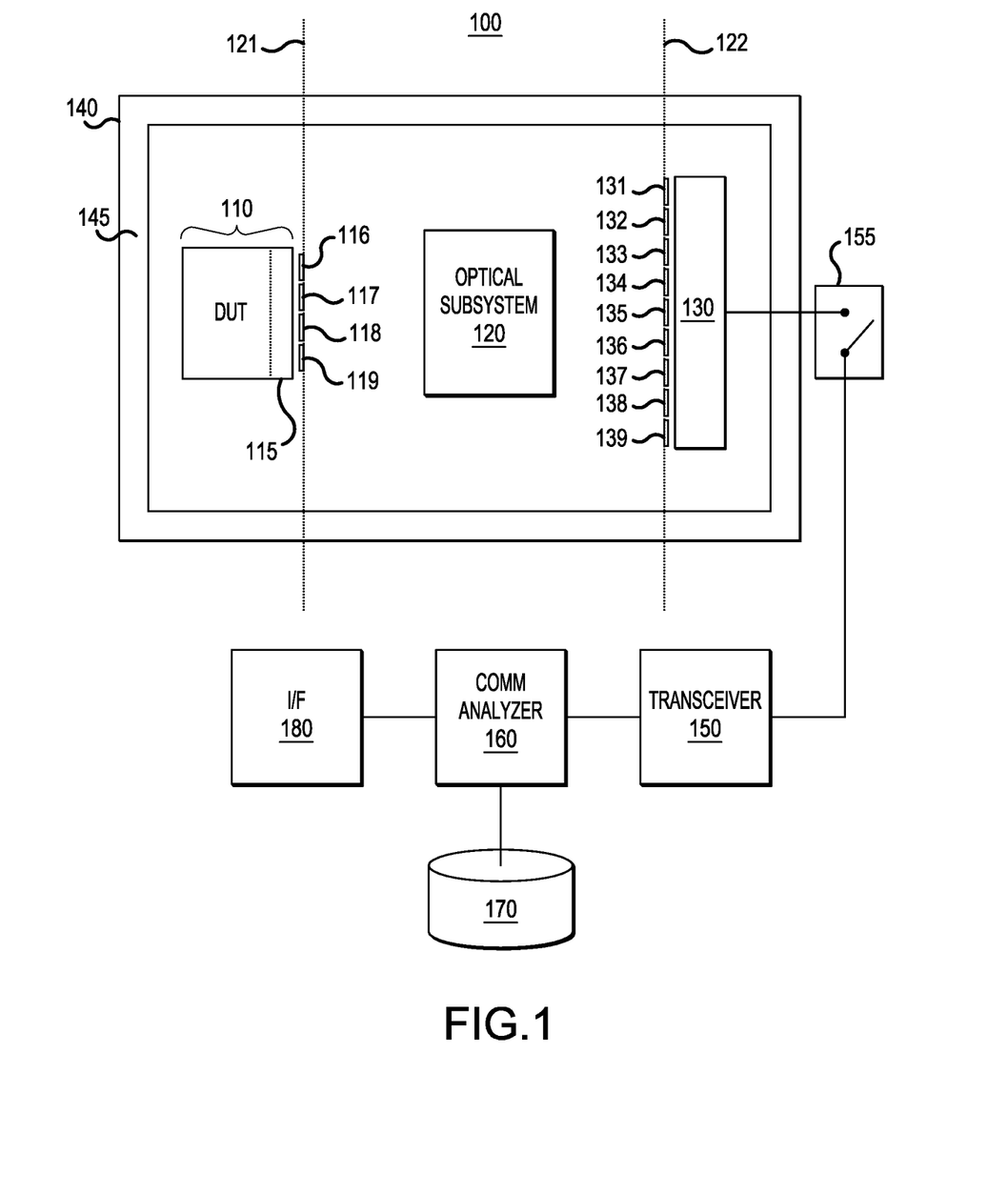
FIG. 1 is a simplified block diagram of a system for characterizing a device under test (DUT), including an integrated antenna array, according to a representative embodiment.

FIG. 1 is a simple block diagram of a system for characterizing a device under test (DUT), including an integrated antenna array, according to a representative embodiment.

Referring to FIG. 1, system 100 is configured to characterize DUT 110, which includes, for example, testing and calibrating antenna array 115, which may be referred to as "DUT antenna array" or "antenna under test (AUT)." The antenna array 115 is integrated with the DUT 110, as indicated by the dotted line, in that the transmit and receive chains of the DUT 110 are directly connected to the elements of the antenna array 115, as opposed to a separate and independently measurable antenna system. In the depicted embodiment, the antenna array 115 includes antennas 116-119, which may be arranged in a matrix-type format, although the antenna array 115 may include various other numbers and arrangements of the antenna, depending on the design of the DUT 110, for example.

Because the antenna array 115 is integrated with the DUT 110, with no RF connections, the antenna array 115 cannot be tested in isolation. That is, it is not possible to simply test the antenna profile of the antenna array 115, and then separately test functionality of the transmitter chain and/or receiver chain of the DUT 110. The characterization of the DUT 110 and the antenna array 115 is therefore performed at the same time, as discussed below.

In the depicted embodiment, the system 100 includes an optical subsystem 120 having a first focal plane 121 and a second focal plane 122, and a measurement array (or probe) 130 including array elements 131-139, which may be arranged in a matrix-type format, although the measurement array 130 may include various other numbers and arrangements of the antenna, depending on the design of the measurement array 130, for example. Each of the first focal plane 121 and the second focal plane 122 includes a corresponding focal point of the optical subsystem 120.

As discussed below, examples of the optical subsystem 120 include a lens, a curved mirror (such as a parabolic mirror, for example), multiple lenses or mirrors, or a hybrid of lens(es) and mirror(s). When the optical subsystem 120 is a lens, the second focal plane 122 may be on an opposite side of the lens than the first focal plane 121. When the optical subsystem 120 is a curved mirror, the second focal plane 122 may be on the same side of the cured mirror as the first focal plane 121, but at different angular locations, e.g., when an off-axis parabolic mirror is utilized. Regardless, the antenna array 115 of the DUT 110 is positioned in a beam overlap region with respect to the first focal plane 121, where the beam overlap region extends from the first focal plane 121 to a plane at with the beams do not sufficiently overlap a surface of interest of the DUT 110 (e.g., a surface area covered by the antenna array 115), discussed below with reference to FIG. 4. The beam overlap region may also be referred to as a "quiet zone."

The array elements 131-139 of the measurement array (or probe) 130 are positioned substantially on the second focal plane 122 of the optical subsystem 120. With respect to being "substantially" on a focal plane, a general rule for the measurement array 130 is that the displacement, d, from the focal plane is less than about 25 percent of the focal length, f.

Another general rule for the far-field measurements is that the beam overlap region (or quiet zone) is substantially cone shaped, with the larger side of the cone at the first focal plane 121, where the beam overlap region diminishes as the beams diverge from one another the further they are away from the first focal plane 121. That is, multiple collimated beams radiated from the array elements 131-139, for example, are reflected or focused by the optical subsystem 120, and diverge from one another. So, at the first focal plane 121, the beams substantially overlap, and spread apart as they become further away from the first focal plane 121, thereby shrinking the volume in which the beams overlap. The beam overlap region extends to a furthest distance at which the beams sufficiently overlap on a surface of interest of the DUT 110, such as the surface area covered by the antenna array 115. Thus, when the antenna array 115 of the DUT 110 is in the beam overlap region, the antenna array 115 is able to receive all beams transmitted from (or transmitted to) the various array elements 131-139. Similarly, when the antenna array 115 of the DUT 110 is in the beam overlap region, each array element 131-139 of the array 130 is able to detect a portion of a beam transmitted from antenna array 115.

Figure 4:
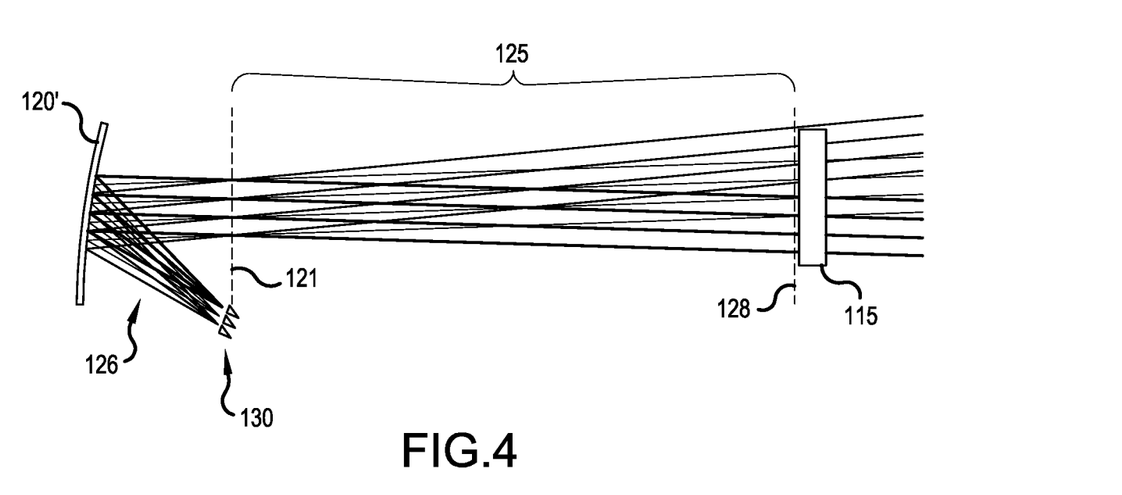
FIG. 4 is a simplified schematic diagram of a DUT with an integrated antenna array apart from the focal plane of an optical system, according to a representative embodiment.

FIG. 4 is a schematic diagram of the antenna array 115 of the DUT 110 positioned at the end of a beam overlap region 125, which extends from the first focal plane 121, according to a representative embodiment. Of course, the antenna array 115 may be positioned anywhere within the beam overlap region 125, including on the first focal plane 121, to successfully receive (or transmit) collimated beams.

Referring to FIG. 4, three illustrative collimated beams, collectively referred to as beams 126, are transmitted by array elements (e.g., 131-133) of the measurement array 130, for purposes of illustration. Of course, more or fewer collimated beams may be transmitted from the measurement array 130 and received by the antenna array 115, without departing from the scope of the present teachings. Also, in the depicted example, the three array elements are transmitting corresponding beams toward an optical system, which may be a mirror 120' (such as curved mirror 320, discussed below with reference to FIG. 3) configured to reflect the multiple beams into the beam overlap region 125. In other configurations, the optical system may be a lens (such as lens 220, discussed below with reference to FIG. 2) configured to pass the multiple beams toward a focal plane on an opposite side of the lens from the measurement array 130. Of course, in still other configurations, the antenna array 115 may transmit multiple signals while positioned in the overlap region 125, such that the measurement array 130 receives the signals, while positioned substantially on the second focal plane 122.

The beam overlap region 125 extends from the first focal plane 121 to the farthest distance 128 from the first focal plane 121 at which the beams 126 still sufficiently overlap the surface of interest of the DUT 110, enabling measurements with energy from each of the antenna elements. The first focal plane 121 is located where the beams 126 overlap substantially entirely (i.e., the region with the largest cross-sectional area in which the beams 126 overlap. The cross-sectional area in which all the beams overlap begins to diminish until there is no cross-sectional area in which the antenna array 115 is able to see all the beams at the same time. That is, each beam is at a different angle, so eventually as the antenna array 115 moves farther from the first focal plane 121, the area in which the beams 126 overlap gets smaller until at distance 128, there is no area in which all beams 126 overlap. That is, moving away from the first focal plane 121, the multiple beams 126 overlap less, until all of the multiple beams are spatially separated from one another past the end of the beam overlap region 125, as shown in FIG. 4 to the right of the antenna array 115.

Also as shown in FIG. 4, the beam overlap region 125 is generally cone-shaped with a large area toward the first focal plane 121 and diminishing in size the farther away from the first focal plane 121. The diminishing size of the beam overlap region 125 means that smaller DUTs can be positioned further away from the mirror 120' (to be entirely in the beam overlap region 125) than larger DUTs, although a DUT can be adequately tested anywhere within the beam overlap region 125 as long as all the beams 126 overlap its entire surface of interest (e.g., the surface area of the antenna array 115).

Referring again to FIG. 1, with regard to the measurement array 130, although nine array elements are depicted (array elements 131-139) uniformly spaced in an array pattern, it is understood that different numbers of array elements (e.g., one or more array elements) and arrangements (e.g., a square or matrix-type array pattern) may be incorporated, without departing from the scope of the present teachings.

The measurement array 130 is configured to transmit beams to the antenna array 115 and/or to receive signals from the antenna array 115 via the optical subsystem 120 in order to measure various characteristics of the DUT 110 and/or the antenna array 115. Unlike conventional systems, the system 100 is able to measure the characteristics of the integrated DUT 110 and/or the antenna array 115 with each of the array elements 131-139 of the measurement array 130. Each of the array elements 131-139 provides DUT characteristic measurements associated with particular radiation angles with respect to the DUT 110. Because of the multiple array elements 131-139, these measurements can be made simultaneously and without requiring rotation or mechanical motion. This significantly speeds up the required measurements, which typically must be measured at many angles across a range of angles. Examples of characteristics of the DUT 110 include an error-vector-magnitude (EVM) and adjacent channel leakage ratios (ACLRs), and examples of characteristics of the antenna array 115 include antenna profile and effective isotropic radiated power (EIRP). Because these characteristics may be measured or otherwise determined, they may be referred to collectively as "integrated DUT characteristics." Receiving beams at the antenna array 115, in particular, via the optical subsystem 120 enables determination of the receiver antenna profile, EVM or ACLR of the DUT 110 and/or the antenna array 115, for example The simultaneous measurements are possible because a far-field antenna pattern of the antenna array 115, as well as other far-field characteristics of the DUT 110 and corresponding angular dependence the far-field characteristics, can be measured in the second focal plane 122, where the measurement array 130 is positioned, by the configuration of the optical subsystem 120. In other words, the angular distribution of plane waves from the antenna array 115 is transformed to a distribution of off-axis displacement in the second focal plane 122 by the optical subsystem 120. Thus, in the second focal plane 122, a certain displacement corresponds to a certain angle of each output signal of the antenna array 115 (in the first focal plane 121). In this way, the array elements 131-139 are able to measure the antenna profile of the DUT 110 transmitter, and at the same time, the EVM of the signals from the antenna array 115 aimed at a certain angle and/or the ACLR at the same angle.

Further, a near-field antenna pattern of the antenna array 115 is determinable using a Fourier transform of the far-field antenna pattern at the measurement array 130. That is, the far-field antenna pattern may be transformed into the near-field antenna pattern, and vice versa, using Fourier-optics concepts. The relationship between the far-field antenna pattern and the near-field antenna pattern is provided by the following equation, in which x represents position of the antenna array 115, λ is wavelength of the beam, and U and Û are a Fourier transform pair:

$$U(x) \Rightarrow \frac{1}{\lambda f} \hat{U}\left(\frac{x}{\lambda f}\right)$$

Referring again to FIG. 1, the system 100 further includes an anechoic chamber 140, configured to house the DUT 110, the optical subsystem 120, and the measurement array 130. As discussed above, the DUT 110 has integrated antenna array 115, as indicated by the dotted line. Each of the internal walls of the anechoic chamber 140 is covered by an electromagnetic wave absorbing material 145, such as absorbing foam. The electromagnetic wave absorbing material 145 minimizes reflections from the internal walls, e.g., by several tens of decibels, reducing interference. As mentioned above, placement of the antenna array 115 in a beam overlap region (e.g., beam overlap region 125) with respect to the first focal plane 121, as discussed above, and placement of the measurement array 130 substantially on the second focal plane 122, results in creation of the far-field antenna pattern and other far-field characteristics of the DUT 110 that can be measured in the second focal plane 122. Thus, even at high RF frequencies (e.g., mmWave frequencies above 5 GHZ), the distances between the antenna array 115 and the measurement array 130 from the optical subsystem 120, respectively, may be relatively small (e.g., less than 100 cm).

Accordingly, the anechoic chamber 140 may likewise by relatively small, particularly in comparison to conventional systems. Due to the anechoic chamber 140, the system 100 is considered a compact antenna test range (CATR), which is more manageable and accurate for determining far-field measurements, as opposed to outdoor test ranges, for example. Thus, the system 100 is able to fully characterize (e.g., provide antenna profile, EIRP, EVM and ACLRs) a DUT 110 having an integrated antenna array 115 with a large far-field (e.g., greater than about 1 m) in a compact manner. Also, the system 100 enables fast measurement speed and reciprocal receive and transmit testing using the same configuration, for simultaneous, low cost characterization of the DUT 110 and the antenna array 115.

The array elements 131-139 of the measurement array 130 may include a variety of different types of components, to provide unique benefits for any particular situation or to meet application specific design requirements of various implementations, as would be apparent to one skilled in the art. For example, the array elements 131-139 may include antennas connected to one or more receivers and/or transceivers. In the depicted embodiment, for purposes of illustration, the array elements 131-139 are indicated as antennas, which are selectively connected to representative transceiver 150 through operation of a representative switch 155. The transceiver 150 is therefore able to receive the transmitted signals from the antenna array 115 and to transmit beams to the antenna array 115 via the array elements 131-139 in the measurement array 130, respectively.

Although the depicted embodiment shows one transceiver (150) and one switch (switch 155) operable with the multiple array elements 131-139, it is understood that other numbers of transceivers and switches may be incorporated without departing from the scope of the present teachings. For example, each of the array elements 131-139 may have a corresponding, dedicated switch for selectively connecting the array elements 131-139 to the transceiver 150. Or, each of the array elements 131-139 may have a corresponding, dedicated transceiver, in which case the array elements 131-139 may be connected to the corresponding transceiver and there would be no need for the switch(es) 155. Also, as mentioned above, a receiver may be used in place of the transceiver 150, in which case the DUT 110 and integrated antenna array 115 may be characterized, as discussed herein, but there could be no reciprocal transmission to antenna array 115. Alternatively, a transmitter may be used in place of the transceiver 150.

The transceiver 150 and the switch 155 are shown as being outside the anechoic chamber 140, and configured to communicate with the measurement array 130 by a physical connection (as shown), such as a cable, passing through the wall(s) of the anechoic chamber 140, or wirelessly. However, it is understood that one or both of the transceiver 150 and the switch 155 may be located inside the anechoic chamber 140, without departing from the scope of the present teachings. Various components may communicate wirelessly within the anechoic chamber 140, as well.

In the depicted embodiment, the system 100 further includes a communication analyzer 160 configured to perform the substantially simultaneous measurements of the integrated DUT characteristics, memory 170 configured to store at least a portion of the measurement results; and interface (I/F) 180 to enable interfacing with a user and/or another test device. For example, the I/F 180 may include display 186 configured to display at least a portion of the measurement results, as well a user input device 188 configured to receive user commands. The user input device 188 may include a keyboard, a mouse, a touch pad and/or a touch-sensitive display, although any other compatible means of providing input may be incorporated without departing from the scope of the present teachings.

The communication analyzer 160 may be implemented by a computer processor, application specific integrated circuits (ASICs), field-programmable gate arrays (FPGAs), or combinations thereof, using software, firmware, hard-wired logic circuits, or combinations thereof. Examples of the communication analyzer 160 may include a signal generator, a signal analyzer, a communication transceiver, or various combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system. The memory 170 may be implemented by any number, type and combination of random access memory (RAM) and read-only memory (ROM), for example, and may store various types of information, such as computer programs and software algorithms executable by the communication analyzer 160 (and/or other components), as well as raw data and/or measurement data storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

Alternatively, the array elements 131-139 may include detectors, such as power sensing diodes. The power sensing diodes may be configured to perform the substantially simultaneous measurements of the integrated DUT characteristics, for example, measurements of the antenna profile, which is basically power measured as a function of angle. In various embodiments, the measurements may be sent to the communication analyzer 160 and/or the memory 170.

As mentioned above, the depicted embodiment allows for measurement of the DUT 110 in a reciprocal manner, when the array elements 131-139 of the measurement array 130 are antennas selectively connected to the transceiver 150. In this case, the array elements 131-139 are further configured to transmit substantially collimated beams to the antenna array 115, via the optical subsystem 120. That is, each of the array elements 131-139 generates a substantially collimated beam having a particular angle at the antenna array 115, the beams creating a far-field pattern input to the DUT 110. In this way, the receiver beam pattern or EIS of the DUT 110 may be measured by rotating the DUT 110, for example, in the presence of the collimated beams from the optical subsystem 120. At the same time, the EVM of the receiver channel may be measured when the source (transceiver 150) is modulated. The ACLR of the receive channel may also be measured. As mentioned above, the receive test for the DUT 110 typically involves an interfering blocker that presents a far-field illumination from a different angle. This can be accomplished by simultaneously illuminating the DUT 110 with modulated beams from two different array elements 131-139 in the second focal plane 122.

In comparison, the embodiments herein include multiple array elements (e.g., array elements 131-139) of a measurement array (e.g., measurement array 130), as opposed to a single probe of a conventional system, where the multiple array elements are substantially on the second focal plane 122. One of the array elements 131-139 may be located at the focal point (or substantially at the focal point, as the array elements 131-139 are substantially on the second focal plane 122) of the optical subsystem 120, although not necessarily. With regard to the array elements 131-139 that are displaced from the focal point, accuracy of the corresponding measurements decreases the further the array elements 131-139 are from the focal point, and so the array elements 131-139 are on (as mentioned above) or close to the focal point. For example, in various embodiments, the displacement of each of the array elements 131-139 close to the focal point is within about 25 percent of the focal length of the optical subsystem 120. This enables the measurement array 130 to measure simultaneously multiple angles of the radiated signals received from the antenna array 115, for example, to determine angular dependence of various far-field characteristics of the beam. The far-field characteristics include antenna pattern and EIRP, for example. Similarly, this arrangement allows array elements 131-139 to provide beams at different angles to the DUT 110 for measurements of the DUT's receiver characteristics, such as effective isotropic sensitivity (EIS), for example. Placement of the array elements 131-139 may limit the range of angles to be measured simultaneously, although angles outside the range may still be measured by rotating the DUT 110 in elevation and azimuth angles.

The array elements 131-139 not located at the focal point of the optical subsystem 120 still produce substantially collimated beams, but not perfectly collimated beams, when transmitting. Also, amplitude and phase ripple of these substantially collimated beams from multiple array elements 131-139 in the beam overlap region (quiet zone) will not be as small as amplitude and phase ripple of a beam originating from a single probe at the focal point. For at least these reasons, conventional systems included just the single probe, and did not incorporate multiple array elements (or multiple antennas generally), as in the present embodiments, because they were considered unhelpful for passive antenna testing, and performance off-focus was known to degrade. However, physical optics simulations show that, according to various embodiments, when the multiple array elements 131-139 are close to the focal point, as discussed above, the respective measurements are sufficient to determine the DUT and/or integrated antenna array characteristics. In addition, when receiving signals from the DUT, each of the array elements 131-139 of the measurement array 130 may measure signals and characteristics transmitted at a particular angle from the DUT 110, enabling the measurement array 130 to measure simultaneously multiple angles of the antenna pattern of the antenna array 115 and other characteristics of the DUT 110, as mentioned above. This cannot be accomplished using the single probe conventional systems.

Path loss and other losses may reduce signal-to-noise ratio (SNR) of a particular measurement. However, in the depicted embodiment, the Poynting vector for the wave at the second focal plane 122, opposite the DUT 110 and integrated antenna array 115, is approximately perpendicular to the measurement array 130. This allows for high-gain and directional antennas to be used as the array elements 131-139, as mentioned above, such that signal levels may be increased.

Figure 2:
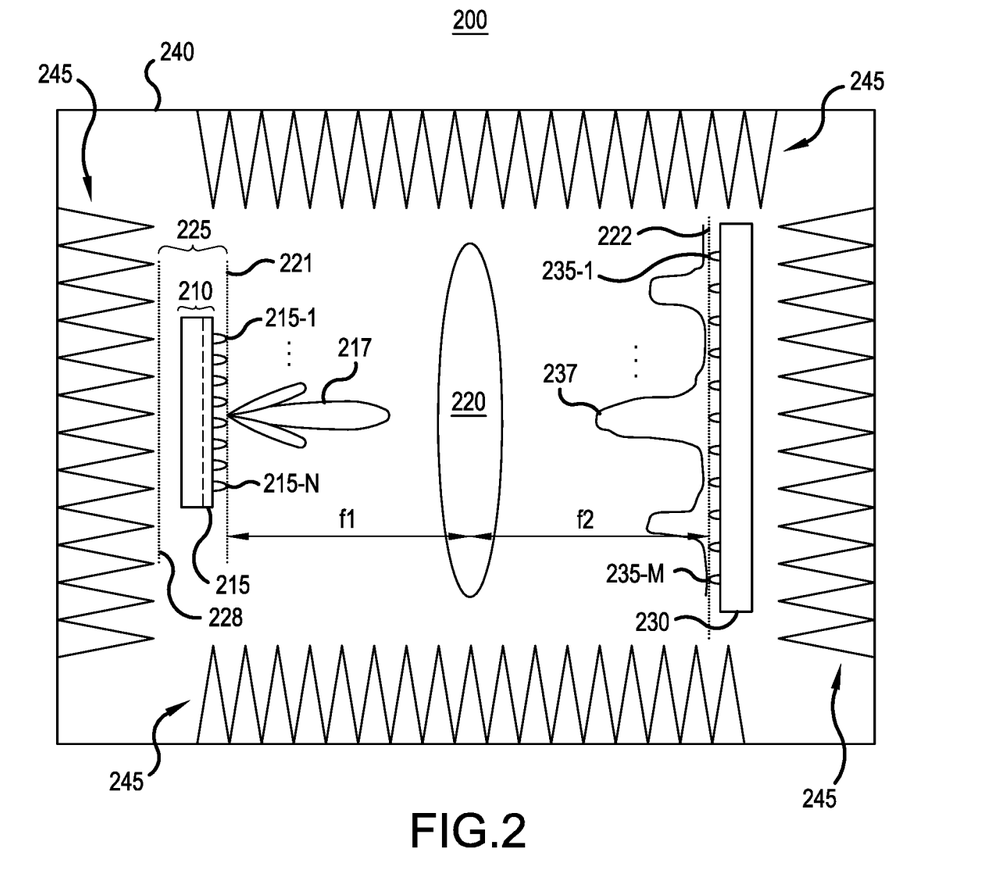
FIG. 2 is a simplified cross-sectional view of a system for characterizing a DUT with an integrated antenna array, including a lens as the optical subsystem, according to a representative embodiment.

FIG. 2 is a simplified cross-sectional view of a system for characterizing a DUT with an integrated antenna array, including a lens as the optical subsystem, according to a representative embodiment.

Referring to FIG. 2, system 200 is configured to characterize a DUT 210 with an integrated antenna array 215, indicated by the dashed line. In the depicted example, the antenna array 215 includes antennas 215-1 to 215n (where n is a positive integer), e.g., arranged in a matrix-type format, although the antenna array 215 may include various numbers and arrangements of the antennas, depending on the design of the DUT 210, for example. The DUT 210 and the integrated antenna array 215 are generally similar to the illustrative DUT 110 and integrated antenna array 115 described above with reference to FIG. 1.

In the depicted embodiment, the system 200 includes a lens 220 as the optical subsystem, where the lens 220 has a first focal plane 221 and a second focal plane 222. The lens 220 is a double convex lens, although different types of lenses configured to provide corresponding first and second focal planes, such as a plano-convex lens or a double convex lens, for example, may be incorporated without departing from the scope of the present teachings. The antenna array 215 (and/or the DUT 210) is located in a beam overlap region 225, which includes the first focal plane 221.

The system 200 also includes a measurement array 230, having one or more array elements 235-1 to 235-m (where m is a positive integer), e.g., arranged in a matrix-type format, although the measurement array 230 may include various numbers and arrangements of the elements to provide unique benefits for any particular situation or to meet application specific design requirements of various implementations, as would be apparent to one skilled in the art. For example, as mentioned above, the measurement array 230 may include a single array element (e.g., 235-1). The measurement array 230 and the array elements 235-1 to 235-n are generally similar to the illustrative measurement array 130 and array elements 131-139 described above. For example, in various configurations, the measurement array 230 may be connected to one or more transceivers (150) and one or more switches (155), as well as a communication analyzer (160), memory (170) and an interface (180). The measurement array 230 is located substantially on the second focal plane 222, thus the antenna array 215 and the measurement array 230 are on opposite sides of the lens 220. The DUT 210 and integrated antenna array 215, the lens 220, and the measurement array 230 are located within an anechoic chamber 240, which includes absorbing material 245 on the interior walls.

As discussed above, the far-field antenna pattern of the antenna array 215 and other far-field characteristics of the DUT can be measured in the second focal plane 222, along with corresponding angular dependence, where the measurement array 230 is positioned, by the configuration of the lens 220. Each array element 235-1 to 235-m of the measurement array 230 measures a different angle of at least the far-field antenna pattern of antenna array 215. Accordingly, the system 200 is able to measure the characteristics of the integrated DUT 210 and antenna array 215 as a function of far-field angle simultaneously at each of the array elements 235-1 to 235-n of the measurement array 230, including the EVM and the ACLRs of the DUT 210, the antenna profile, and the EIRP. For purposes of illustration, each of the focal length f1 from the lens 220 to the first focal plane 221 and the focal length f2 from the lens 220 to the second focal plane 222 is about 70 cm. Also, for purposes of illustration, the DUT 210 may be a wireless communications device operating at 28 GHz, and the antenna array 215 may be an 8×8 antenna array in which the antennas are separated by $\lambda/2$ (where $\lambda$ is the wavelength of the RF signal transmitted from the antenna array 215). More generally, the antenna array 215 comprises an M×N array of antennae, where M and N are positive integers, respectively, separated from one another by $\lambda/2$. As mentioned above, the antenna array 215 is located in the beam overlap region 225, which extends from the first focal plane 221 to the farthest distance 228 from the first focal plane 221 at which the beams still sufficiently overlap the surface of interest of the DUT 210 (that is, the surface area of the antenna array 215), as discussed above with reference to the beam overlap region 125. The antenna array 215 may be placed at different distances from the first focal plane 221 within the beam overlap region 225. For purposes of illustration, the antenna array 215 is shown relatively close to the first focal plane 221, although it may be placed anywhere within the beam overlap region 225 as long as the beams sufficiently overlap the surface of interest.

In the example of FIG. 2, the antenna array 215 is approximately 4 cm across, and may emit an RF signal having representative antenna pattern 217. The RF signal is received at the measurement array 230 located substantially on the second focal plane 222 for measurement, indicated by antenna profile 237, which provides amplitude and phase directly. For purposes of illustration, the measurement array 230 may include about 9 array elements arranged in a 3×3 array (e.g., like array elements 131-139, discussed above) with an array pitch of about 3 cm spacing, thus providing about 2.5 degree angular resolution for antenna profile measurements, although other specifications may be incorporated, e.g., depending on design requirements and/or DUT and integrated antenna characteristics, without departing from the scope of the present teachings. Also, as discussed above, receiver testing of the DUT 210 may be accomplished in a reciprocal fashion. Transmitters in a second focal plane would appear as far-field with angle of incidence determined by position off axis. Blocking could be implemented in substantially the same manner.

In the depicted embodiment, reflections from the lens 220 may cause issues with multiple beam bounces. The effects of the reflections may be mitigated by positioning an attenuator (not shown) between the DUT 210 and the lens 220. Also, when the measurement array 230 is a one-dimensional array, for example, the lens 220 may be cylindrical and tilted to ensure multi-bounce reflections are not sensed on the measurement array 230.

Figure 3:
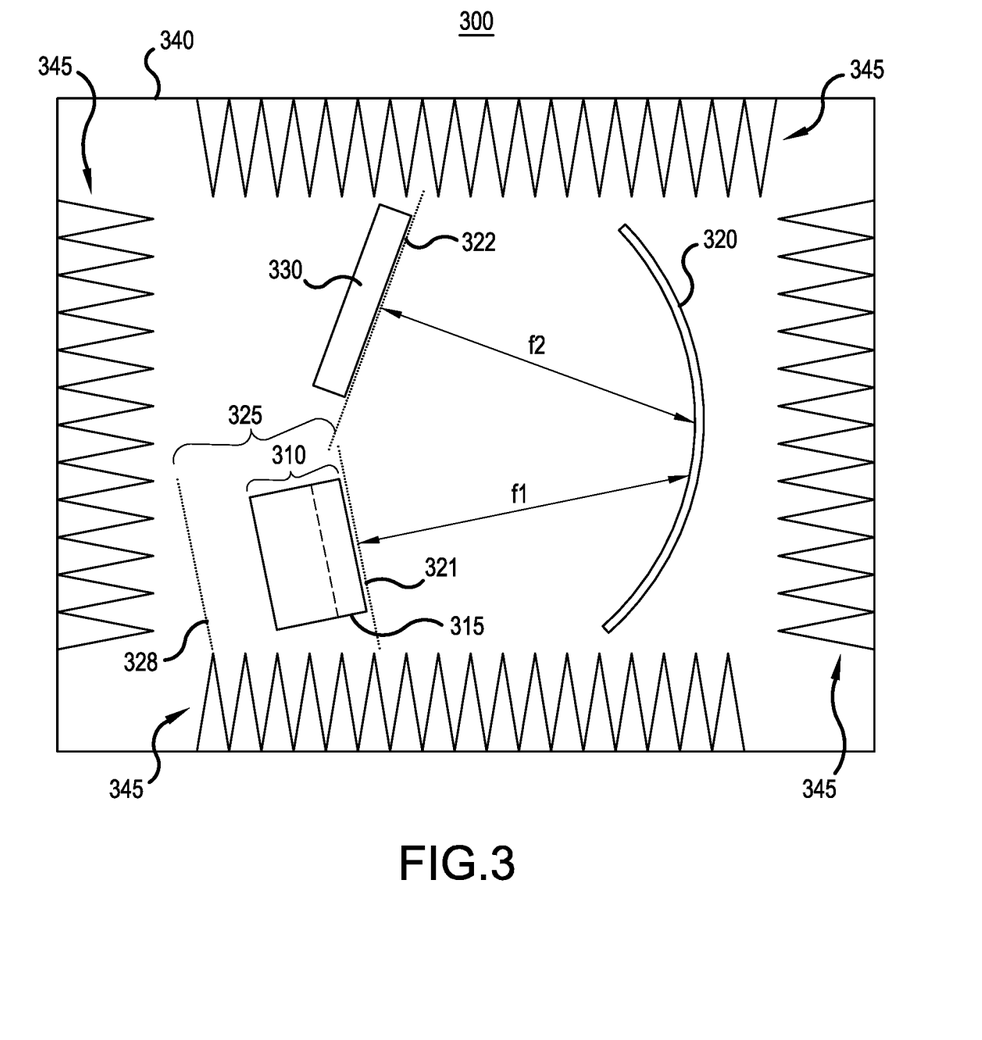
FIG. 3 is a simplified cross-sectional view of a system for characterizing a DUT with an integrated antenna array, including a mirror as the optical subsystem, according to a representative embodiment.

FIG. 3 is a simplified cross-sectional view of a system for characterizing a DUT with an integrated antenna array, including a mirror as the optical subsystem, according to a representative embodiment.

Referring to FIG. 3, system 300 is configured to characterize a DUT 310 with an integrated antenna array 315, indicated by the dashed line. In the depicted example, the antenna array 315 includes antennas 315-1 to 315n (where n is a positive integer), e.g., arranged in a matrix-type format, although the antenna array 315 may include various numbers and arrangements of the antennas, depending on the design of the DUT 310, for example. The DUT 310 and the integrated antenna array 315 are generally similar to the illustrative DUT 110 and integrated antenna array 115 described above with reference to FIG. 1.

In the depicted embodiment, the system 300 includes a curved mirror 320 as the optical subsystem, where the curved mirror 320 has a first focal plane 321 and a second focal plane 322. The curved mirror 320 may be a parabolic mirror (similar to mirror 120' in FIG. 4), for example, although different types of curved mirrors configured to provide corresponding first and second focal planes may be incorporated without departing from the scope of the present teachings. In the present example, the curved mirror 320 has a parabolic shape with a focal point about 70 cm from the surface, and an area of about 50 cm×50 cm, although other dimensions may be incorporated, e.g., depending on design requirements and/or DUT and integrated antenna characteristics, without departing from the scope of the present teachings. The antenna array 315 (and/or the DUT 310) is located substantially on the first focal plane 321.

The system 300 also includes a measurement array 330, having one or more array elements (not shown in FIG. 3), e.g., arranged in a matrix-type format, although the measurement array 330 may include various numbers and arrangements of the array elements to provide unique benefits for any particular situation or to meet application specific design requirements of various implementations, as would be apparent to one skilled in the art. For example, as mentioned above, the measurement array 330 may include a single array element. The measurement array 330 and the array elements are generally similar to the illustrative measurement array 130 and array elements 131-139 described above. For example, in various configurations, the measurement array 330 may be connected to one or more transceivers (150) and one or more switches (155), as well as a communication analyzer (160), memory (170) and an interface (180). The measurement array 330 is located substantially on the second focal plane 322, thus the antenna array 315 and the measurement array 330 are on the same side of the curved mirror 320, although position at different angles. The DUT 310 and integrated antenna array 315, the curved mirror 320, and the measurement array 330 are located with an anechoic chamber 340, which includes absorbing material 345 on the interior walls.

As discussed above, the far-field antenna pattern of the antenna array 315 and other far-field characteristics of the DUT 310 can be measured in the second focal plane 322, where the measurement array 330 is substantially positioned, by the configuration of the curved mirror 320. Accordingly, the system 300 is able to measure simultaneously multiple angles of the characteristics of the integrated DUT 310 and antenna array 315. At any given time, each of the array elements 335-1 to 335-$n$ of the measurement array 330, is able to measure characteristics including the EVM and the ACLRs of the DUT 310, and the antenna profile and EIRP of the antenna array 315. These characteristics of the DUT 310 vary with transmitted or received angular directions. For a given DUT rotation, each of the array elements 335-1 to 335-$n$ will measure these characteristics at a different angle.

For purposes of illustration, each of the focal length f1 from the curved mirror 320 to the first focal plane 321 and the focal length f2 from the curved mirror 320 to the second focal plane 322 is about 70 cm. The antenna array 315 is located in the beam overlap region 325, which extends from the first focal plane 321 to the farthest distance 328 from the first focal plane 321 at which the beams still sufficiently overlap the surface of interest of the DUT 310 (that is, the surface area of the antenna array 315), as discussed above with reference to the beam overlap region 125. For purposes of illustration, the antenna array 315 is shown relatively close to the first focal plane 321, although it may be placed anywhere within the beam overlap region 325 as long as the beams sufficiently overlap the surface of interest.

In the example of FIG. 3, the antenna array 315 is approximately 20 cm across, and may emit an RF signal having a representative antenna pattern which may be substantially the same as that of antenna array 215 in FIG. 2. The RF signal is received at the measurement array 330 located substantially on the second focal plane 322 for measurement, which provides a corresponding antenna profile, which may be substantially the same as the antenna profile 237 in FIG. 2. For purposes of illustration, the measurement array 330 may be about 10 cm×10 cm in area, with about a 1 cm displacement on array approximately equal to 1 degree beam angle variation for antenna profile measurements. As discussed above, receiver testing of the DUT 310 may be accomplished in a reciprocal fashion.

Accordingly, a system is provided for determining far-field characteristics of a DUT having integrated antenna array. The system includes an optical subsystem having first and second focal planes, where the integrated antenna array is positioned substantially on the first focal plane of the optical subsystem. The optical subsystem may be a lens or a curved mirror, for example. The system further includes a measurement array having one or more array elements positioned substantially on the second focal plane of the optical subsystem. The measurement array is configured to receive signals transmitted from the integrated antenna array via the optical subsystem. A far-field antenna pattern of the integrated antenna array is present at the measurement array, enabling substantially simultaneous measurements of far-field DUT characteristics at corresponding angular dependencies at each array element of the one or more array elements in the measurement array. Various embodiments enable measurement of the DUT in a reciprocal manner, when the measurement array includes antennas that are (selectively) connected to one or more transceivers.

The various components, structures, characteristics and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A system for characterizing a device under test (DUT) comprising an integrated antenna array, the system comprising:

an optical subsystem having first and second focal planes, wherein the integrated antenna array is positioned in a substantially cone-shaped beam overlap region having a larger side of the cone at the first focal plane and extending from the first focal plane of the optical subsystem, wherein the beam overlap region diminishes until there is no cross-sectional area in which the antenna array is exposed to all beams at the same time; and a measurement array comprising a plurality of array elements positioned substantially on the second focal plane of the optical subsystem, the measurement array being configured to transmit substantially collimated beams to the DUT, and/or to receive signals from the DUT, via the optical subsystem, wherein the measurement array enables measurement of at least one far-field characteristic of the DUT and an angular dependence of each of the at least one far-field characteristic.

2. The system of claim 1, wherein the at least one DUT far-field characteristic comprises at least one of an antenna profile, an effective isotropic radiated power (EIRP), a total radiated power of the integrated antenna array, an error-vector-magnitude (EVM), and an adjacent channel leakage ratio (ACLR).

3. The system of claim 1, further comprising:
an anechoic chamber housing the DUT, the optical subsystem, and the measurement array.

4. The system of claim 1, wherein the plurality of array elements in the measurement array comprises a plurality of detectors.

5. The system of claim 4, wherein the plurality of detectors comprises a plurality of power sensing diodes configured to perform the measurements of the at least one DUT far-field characteristic.

6. The system of claim 1, wherein the beam overlap region extends from the first focal plane to a furthest distance at which the substantially collimated beams sufficiently overlap a surface area of the integrated antenna array.

7. The system of claim 6, further comprising:
a switch;
at least one receiver selectively connectable to each of the plurality of array elements via the switch; and
a communication analyzer configured to perform the measurements of the at least one DUT far-field characteristic.

8. The system of claim 7, further comprising:
a memory configured to store at least a portion of the measurements; and
a display configured to display at least a portion of the measurements.

9. The system of claim 1, wherein the optical subsystem comprises a curved mirror.

10. The system of claim 1, wherein the optical subsystem comprises a lens.

11. The system of claim 1, wherein the beam overlap region diminishes as beams diverge from one another the further they are away from the first focal plane.

12. The system of claim 1, wherein the at least one far-field characteristic comprises a far-field antenna pattern.

13. A system for characterizing a device under test (DUT) comprising an integrated antenna array, the system comprising:
a curved mirror having a first focal plane and a second focal plane, wherein the integrated antenna array is positioned in a substantially cone-shaped beam overlap region having a larger side of the cone at the first focal plane and extending from the first focal plane of the curved mirror, wherein the beam overlap region diminishes until there is no cross-sectional area in which the antenna array is exposed to all beams at the same time; and
a measurement array comprising a plurality of array elements positioned substantially on the second focal plane of the curved mirror, the plurality of array elements being configured to receive signals from the DUT and reflected by the curved mirror, and/or to transmit substantially collimated beams to the DUT and reflected by the curved mirror,
wherein at least one far-field DUT characteristic is measured at the measurement array, enabling determination of the at least one DUT characteristic as a function of angle by the plurality of array elements.

14. The system of claim 13, wherein the beam overlap region extends from the first focal plane to a furthest distance at which the substantially collimated beams sufficiently overlap a surface area of the integrated antenna array.

15. The system of claim 13, further comprising:
an anechoic chamber housing the DUT, the curved mirror and the measurement array.

16. The system of claim 13, wherein the curved mirror comprises a parabolic mirror.

17. A system for characterizing a device under test (DUT) comprising an integrated antenna array, the system comprising:
a lens having a first focal plane on one side of the lens and a second focal plane on an opposite side of the lens, wherein the integrated antenna array is positioned in a beam overlap region extending from the first focal plane of the lens, wherein the beam overlap region has a substantially cone shape with a larger end at the first focal plane, wherein the beam overlap region diminishes until there is no cross-sectional area in e antenna array is exposed to all beams at the same time; and
a measurement array comprising a plurality of array elements substantially positioned on the second focal plane of the lens, the plurality of array elements being configured to receive signals from the DUT through the lens, and/or to transmit substantially collimated beams to the DUT through the lens,
wherein at least one far-field DUT characteristic is measured at the measurement array, enabling determination of the at least one DUT characteristic as a function of angle by the plurality of array elements.

18. The system of claim 17, wherein the beam overlap region extends from the first focal plane to a furthest distance at which the substantially collimated beams sufficiently overlap a surface area of the integrated antenna array.

19. The system of claim 17, further comprising:
an attenuator positioned between the DUT and the one side of the lens, the attenuator being configured to mitigate reflections by the lens of the substantially collimated beams.

20. The system of claim 19, wherein the integrated antenna array comprises an M×N array of antennae, where M and N are positive integers, respectively, separated from one another by $\lambda/2$, wherein $\lambda$ is a wavelength of the substantially collimated beams.

21. The system of claim 17, wherein the beam overlap region diminishes as beams diverge from one another the further they are away from the first focal plane.

22. The system of claim 17, wherein the at least one far-field characteristic comprises a far-field antenna pattern.

* * * * *

UNITED STATES PATENT AND TRADEMARK OFFICE
CERTIFICATE OF CORRECTION

| | |
|---|---|
| PATENT NO. | : 11,750,303 B2 |
| APPLICATION NO. | : 16/141444 |
| DATED | : September 5, 2023 |
| INVENTOR(S) | : Gregory Douglas Vanwiggeren |

It is certified that error appears in the above-identified patent and that said Letters Patent is hereby corrected as shown below:

In the Claims

In Column 16, Line 29, in Claim 17, delete "e" and insert -- which the --.

Signed and Sealed this
Thirty-first Day of October, 2023

Katherine Kelly Vidal
*Director of the United States Patent and Trademark Office*